US010553787B2

(12) United States Patent
Pinarbasi et al.

(10) Patent No.: US 10,553,787 B2
(45) Date of Patent: *Feb. 4, 2020

(54) PRECESSIONAL SPIN CURRENT STRUCTURE FOR MRAM

(71) Applicant: Spin Memory, Inc., Fremont, CA (US)

(72) Inventors: Mustafa Michael Pinarbasi, Morgan Hill, CA (US); Michail Tzoufras, Sunnyvale, CA (US); Bartlomiej Adam Kardasz, Pleasanton, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/027,739

(22) Filed: Jul. 5, 2018

(65) Prior Publication Data

US 2018/0315920 A1 Nov. 1, 2018

Related U.S. Application Data

(60) Continuation of application No. 15/794,871, filed on Oct. 26, 2017, now Pat. No. 10,026,892, which is a division of application No. 14/814,036, filed on Jul. 30, 2015, now Pat. No. 9,853,206.

(60) Provisional application No. 62/180,412, filed on Jun. 16, 2015.

(51) Int. Cl.
*H01L 43/08* (2006.01)
*H01L 43/02* (2006.01)
*H01L 43/10* (2006.01)
*G11C 11/16* (2006.01)

(52) U.S. Cl.
CPC ............ *H01L 43/08* (2013.01); *G11C 11/161* (2013.01); *G11C 11/1675* (2013.01); *H01L 43/02* (2013.01); *H01L 43/10* (2013.01)

(58) Field of Classification Search
None
See application file for complete search history.

(56) References Cited

U.S. PATENT DOCUMENTS

| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |

(Continued)

FOREIGN PATENT DOCUMENTS

| CA | 2766141 A1 | 1/2011 |
| CN | 101036195 A | 9/2008 |

(Continued)

OTHER PUBLICATIONS

Final Office Action dated Nov. 8, 2018 in U.S. Appl. No. 15/445,260.

(Continued)

*Primary Examiner* — Bo B Jang
(74) *Attorney, Agent, or Firm* — Arnold & Porter Kaye Scholer

(57) ABSTRACT

A magnetoresistive random-access memory (MRAM) is disclosed. MRAM device has a magnetic tunnel junction stack having a significantly improved performance of the free layer in the magnetic tunnel junction structure. The MRAM device utilizes a precessional spin current (PSC) magnetic layer in conjunction with a perpendicular MTJ where the in-plane magnetization direction of the PSC magnetic layer is free to rotate.

17 Claims, 9 Drawing Sheets

(56) References Cited

U.S. PATENT DOCUMENTS

| | | |
|---|---|---|
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,653,154 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai et al. |
| 8,823,118 B2 | 9/2014 | Horng et al. |
| 8,852,760 B2 | 10/2014 | Wang et al. |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,129,690 B2 | 9/2015 | Park et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park et al. |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,777,974 B2 | 10/2017 | Kamitani et al. |
| 9,818,464 B2 | 11/2017 | Saida et al. |
| 9,853,206 B2 | 12/2017 | Pinarbasi et al. |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 10,229,724 B1 | 3/2019 | el Baraji et al. |
| 10,236,047 B1 | 3/2019 | Ryan et al. |
| 10,236,048 B1 | 3/2019 | Tzoufras et al. |
| 10,236,439 B1 | 3/2019 | Schabes et al. |
| 10,270,027 B1 | 4/2019 | Gajek et al. |
| 10,360,961 B1 | 7/2019 | Tzoufras et al. |

(56) References Cited

U.S. PATENT DOCUMENTS

| | | |
|---|---|---|
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0002184 A1 | 1/2006 | Hong et al. |
| 2006/0018057 A1 | 1/2006 | Huai |
| 2006/0044703 A1 | 3/2006 | Inomata et al. |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0185670 A1 | 8/2008 | Kajiyama |
| 2008/0259508 A2 | 10/2008 | Kent et al. |
| 2008/0273274 A1 | 11/2008 | Kojima et al. |
| 2008/0297292 A1 | 12/2008 | Viala et al. |
| 2009/0015958 A1 | 1/2009 | Nakamura et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2009/0244792 A1 | 10/2009 | Nakayama et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2011/0235217 A1 | 9/2011 | Chen et al. |
| 2011/0305077 A1 | 12/2011 | Higo et al. |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 6/2013 | Vetro et al. |
| 2013/0157385 A1 | 6/2013 | Jung et al. |
| 2013/0181305 A1 | 7/2013 | Nakayama et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0013473 P1 | 4/2014 | Kent et al. |
| 2014/0093701 A1 | 4/2014 | Sahoo et al. |
| 2014/0103472 A1 | 4/2014 | Kent et al. |
| 2014/0131824 A1 | 5/2014 | Kitagawa et al. |
| 2014/0159175 A1 | 6/2014 | Lee et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171315 A1 | 6/2015 | Gan et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2015/0372687 A1 | 12/2015 | Buhrman et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0018705 A1 | 1/2017 | Harms et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1 | 8/2017 | Kent et al. |
| 2017/0324029 A1 | 11/2017 | Pinarbasi et al. |
| 2017/0331032 A1 | 11/2017 | Chen et al. |

(56) References Cited

U.S. PATENT DOCUMENTS

| | | |
|---|---|---|
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0205001 A1 | 7/2018 | Beach et al. |
| 2018/0248110 A1 | 8/2018 | Kardasz et al. |
| 2018/0248113 A1 | 8/2018 | Pinarbasi et al. |

FOREIGN PATENT DOCUMENTS

| | | |
|---|---|---|
| CN | 102334207 A1 | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 A | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-098365 | 4/2008 |
| JP | 2008-524830 A | 7/2008 |
| JP | 2008-192832 | 8/2008 |
| JP | 2009-027177 A | 2/2009 |
| JP | 2012-004222 | 1/2012 |
| JP | 2013-012546 A | 1/2013 |
| JP | 2013-048210 | 3/2013 |
| JP | 2013-219010 A | 10/2013 |
| JP | 2014-022751 | 2/2014 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A1 | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2013/027406 | 2/2013 |
| WO | WO 2014-062681 A1 | 4/2014 |
| WO | WO-2015-153142 A1 | 10/2015 |
| WO | WO 2016/011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |
| WO | WO 2017/151735 A1 | 9/2017 |

OTHER PUBLICATIONS

Final Office Action dated Nov. 16, 2018 in U.S. Appl. No. 15/445,362.
Final Office Action dated Dec. 13, 2018 in U.S. Appl. No. 15/091,853.
NonFinal Office Action dated Nov. 23, 2018 in U.S. Appl. No. 15/859,384.
NonFinal Office Action dated Nov. 26, 2018 in U.S. Appl. No. 15/858,950.
Notice of Allowance dated Nov. 9, 2018 in U.S. Appl. No. 15/859,015.
Notice of Allowance dated Nov. 21, 2018 in U.S. Appl. No. 15/859,030.
Notice of Allowance dated Nov. 21, 2018 in U.S. Appl. No. 15/859,374.
Notice of Allowance dated Nov. 30, 2018 in U.S. Appl. No. 15/859,514.
Notice of Allowance dated Dec. 12, 2018 in U.S. Appl. No. 15/858,988.
Notice of Allowance dated Sep. 26, 2018 in U.S. Appl. No. 15/859,047; 10 pages.
Notice of Allowance dated Oct. 24, 2018 in U.S. Appl. No. 15/859,517.
Office Action dated Aug. 30, 2018 in Chinese Patent Application No. 201580009984.2.
Office Action dated Oct. 9, 2018 in Japanese Patent Application No. 2016-526761.
Final Office Action dated Jul. 9, 2015 in U.S. Appl. No. 14/242,419.
Final Office Action dated Jun. 9, 2017 in U.S. Appl. No. 14/814,038.
Final Office Action dated Aug. 2, 2018 in U.S. Appl. No. 15/674,620.
International Search Report and Written Opinion dated May 10, 2018 in PCT/US2018/014645.
International Search Report and Written Opinion dated May 30, 2018 in PCT/US2018/014641.
NonFinal Office Action dated Mar. 20, 2015 in U.S. Appl. No. 14/242,419.
NonFinal Office Action dated Sep. 11, 2015 in U.S. Appl. No. 14/492,943.
NonFinal Office Action dated Jan. 20, 2016 in U.S. Appl. No. 14/242,419.
NonFinal Office Action dated Dec. 9, 2017 in U.S. Appl. No. 14/866,359.
NonFinal Office Action dated Dec. 23, 2016 in U.S. Appl. No. 15/093,367.
NonFinal Office Action dated Jan. 25, 2017 in U.S. Appl. No. 15/097,576.
NonFinal Office Action dated Feb. 6, 2017 in U.S. Appl. No. 14/814,036.
NonFinal Office Action dated Feb. 8, 2017 in U.S. Appl. No. 15/174,482.
Nonfinal Office action dated Jun. 26, 2018 in U.S. Appl. No. 15/859,384.
NonFinal Office Action dated Jun. 29, 2018 in U.S. Appl. No. 15/859,381.
Berger et al.; U.S. Appl. No. 15/174,482, filed Jun. 6, 2016, entitled "Method and Apparatus for Bipolar Memory Write-Verify".
Bozdag et al., U.S. Appl. No. 15/859,047, filed Dec. 29, 2017, entitled "Three-Terminal MRAM with AC Write-Assist for Low Read Disturb".
El Baraji et al., U.S. Appl. No. 15/859,514, filed Dec. 30, 2017, entitled "Microwave Write-Assist in Orthogonal STT-MRAM".
El Baraji et al., U.S. Appl. No. 15/859,517, filed Dec. 30, 2017, entitled "Microwave Write-Assist in Series-Interconnected Orthogonal STT-MRAM Device".
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Gajek et al., U.S. Appl. No. 15/858,988, filed Dec. 29, 2017, entitled "Self-Generating AC Current Assist in Orthogonal STT MRAM".
Ideda et al.; "A perpendicular-anisotropy CoFeB-MgO magnetic tunnel junction"; Nature Materials, vol. 9, Sep. 2010; pp. 721-724; 4 pages.
International Search Report and Written Opinion dated Jul. 10, 2015 in PCT/US2015/021580; 12 pages.
International Search Report and Written Opinion dated Oct. 30, 2015 in PCT/US2015/040700; 11 pages.
International Search Report and Written Opinion dated Dec. 14, 2015 in PCT/US2015/047875; 13 pages.
International Search Report and Written Opinion dated Jun. 17, 2016 in PCT/US2016/021324; 9 pages.

(56) References Cited

OTHER PUBLICATIONS

International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
International Search Report and Written Opinion dated Apr. 7, 2017 in PCT/US2016/067444; 13 pages.
Kardasz et al.; U.S. Appl. No. 14/866,359, filed Sep. 25, 2015, entitled "Spin Transfer Torque Structure for MRAM Devices Having a Spin Current Injection Capping Layer".
Kardasz et al.; U.S. Appl. No. 15/091,853, filed Apr. 6, 2016, entitled "High Annealing Temperature Perpendicular Magnetic Anisotropy Structure for Magnetic Random Access Memory".
Kardasz et al.; U.S. Appl. No. 15/657,498, filed Jul. 24, 2017, entitled "Spin Transfer Torque Structure for MRAM Devices Having a Spin Current Injection Capping Layer".
Kent et al.; U.S. Appl. No. 61/715,111, filed Oct. 17, 2012, entitled "Inverted Orthogonal Spin Transfer Layer Stack".
Koch et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
Lee et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
"Magnetic Technology Sprintronics, Media and Interface"; Data Storage Institute, R&D Highlights; Sep. 2010; 3 pages.
Martens et al., "Thermally Induced Magnetic Switching in Thin Ferromagnetic Annuli"; NSF grants PHY-0351964 (DLS); 2005; 11 pages.
Martens et al., "Magnetic Reversal in Nanoscopic Ferromagnetic Rings"; NSF grants PHY-0351964 (DLS); 2006; 23 pages.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Feb. 8, 2017 in U.S. Appl. No. 15/174,482; 10 pages,
Notice of Allowance dated Apr. 21, 2017 in U.S. Appl. No. 15/157,783; 36 pages.
Notice of Allowance dated Jul. 27, 2017 in U.S. Appl. No. 15/097,576; 22 pages.
Notice of Allowance dated Oct. 16, 2017 in U.S. Appl. No. 14/814,036; 16 pages.
Pinarbasi et al.; U.S. Appl. No. 14/341,185, filed Jul. 25, 2014, entitled "Method for Manufacturing MTJ Memory Device".
Pinarbasi et al.; U.S. Appl. No. 14/492,943, filed Sep. 22, 2014, entitled "Magnetic Tunnel Junction Structure for MRAM Device".
Pinarbasi et al.; U.S. Appl. No. 14/814,036, filed Jul. 30, 2015, entitled "Precessional Spin Current Structure for MRAM".
Pinarbasi et al.; U.S. Appl. No. 15/041,325, filed Feb. 11, 2016, entitled "Method for Manufacturing MTJ Memory Device".
Pinarbasi et al.; U.S. Appl. No. 15/093,367, filed Apr. 7, 2016, entitled "Magnetic Tunnel Junction Structure for MRAM Device".
Pinarbasi et al.; U.S. Appl. No. 15/097,576, filed Apr. 13, 2016, entitled "Polishing Stop Layer(s) for Processing Arrays of Semiconductor Elements".
Pinarbasi et al.; U.S. Appl. No. 15/157,783, filed May 18, 2016, entitled "Memory Cell Having Magnetic Tunnel Junction and Thermal Stability Enhancement Layer".
Pinerbasi et al.; U.S. Appl. No. 15/445,260, filed Feb. 28, 2017, entitled "Precessional Spin Current Structure for MRAM".
Pinarbasi; U.S. Appl. No. 15/445,362, filed Feb. 28, 2017, entitled "Precessional Spin Current Structure for MRAM".
Pinarbasi et al.; U.S. Appl. No. 15/656,398, filed Jul. 21, 2017, entitled "Memory Cell Having Magnetic Tunnel Junction and Thermal Stability Enhancement Layer".
Pinarbasi et al.; U.S. Appl. No. 15/674,620, filed Aug. 11, 2017, entitled "Polishing Stop Layer(s) for Processing Arrays of Semiconductor Elements".
Pinarbasi et al.; U.S. Appl. No. 15/794,871, filed Oct. 26, 2017, entitled "Precessional Spin Current Structure for MRAM".
Ryan et al., U.S. Appl. No. 15/859,015, filed Dec. 29, 2017 entitled "Shared Oscillator (STNO) for MRAM Array Write-Assist in Orthogonal STT-MRAM".
Schabes et al.; U.S. Appl. No. 15/634,629, filed Jun. 27, 2017, entitled "MRAM with Reduced Stray Magnetic Fields".
Schabes et al., U.S. Appl. No. 15/859,384, filed Dec. 30, 2017, entitled "Perpendicular Magnetic Tunnel Junction Device with Skyrmionic Assist Layers for Free Layer Switching".
Schabes et al., U.S. Appl. No. 15/859,381, filed Dec. 30, 2017, entitled "Perpendicular Magnetic Tunnel Junction Device with Precessional Spin Current Layer Having a Modulated Moment Density".
Schabes et al., U.S. Appl. No. 15/859,379, filed Dec. 30, 2017, entitled "Perpendicular Magnetic Tunnel Junction Device with Offset Precessional Spin Current Layer".
Schabes et al., U.S. Appl. No. 15/859,374, filed Dec. 30, 2017, entitled "Switching and Stability Control for Perpendicular Magnetic Tunnel Junction Device".
Schabes et al., U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Seo et al.; "Current-induced synchronized switching of magnetization;" Applied Physics Letters 101; 2012 American Institute of Physics; Aug. 7, 2012; 6 pages.
Tzoufras et al., U.S. Appl. No. 15/858,950, filed Dec. 29, 2017, entitled"AC Current Pre-Charge Written-Assist in Orthogonal STT-MRAM,".
Tzoufras et al., U.S. Appl. No. 15/859,030, filed Dec. 29, 2017, entitled "AC Current Write-Assist in Orthogonal STT-MRAM".
NonFinal Office Action dated Jan. 15, 2019 in U.S. Appl. No. 15/862,788.
Extended European Search Report dated Jan. 30, 2019 in EU Application No. 16812075.6.
NonFinal Office Action dated Jun. 25, 2019 in U.S. Appl. No. 16/197,622.
NonFinal Office Action dated Aug. 15, 2019 in U.S. Appl. No. 15/674,620.
NonFinal Office Action dated Sep. 4, 2019 in U.S. Appl. No. 15/445,260.
NonFinal Office Action dated Sep. 16, 2019 in U.S. Appl. No. 15/445,362.
Notice of Allowance dated Feb. 12, 2019 in U.S. Appl. No. 15/859,381.
Notice of Allowance dated Mar. 21, 2019 in U.S. Appl. No. 15/858,950.
Notice of Allowance dated Jun. 26, 2019 in U.S. Appl. No. 15/091,853.
Office Action dated Jul. 23, 2019 in Japanese Patent Application No. 2016-529428 (with English translation).
Restriction Requirement in U.S. Appl. No. 16/123,663 dated Apr. 24, 2019.

PRECESSIONAL SPIN CURRENT STRUCTURE FOR MRAM

CROSS-REFERENCE TO RELATED APPLICATIONS

This application is a continuation of U.S. patent application Ser. No. 15/794,871, now allowed, which application is a divisional of U.S. patent application Ser. No. 14/814,036, filed Jul. 30, 2015, now issued as U.S. Pat. No. 9,853,206. This application also claims the benefit of Provisional Application No. 62/180,412, filed Jun. 16, 2015. Priority to this provisional application is expressly claimed, and the disclosure of the provisional application is hereby incorporated herein by reference in its entirety.

FIELD

The present patent document relates generally to spin-transfer torque magnetic random access memory and, more particularly, to a magnetic tunnel junction stack having improved performance of the free layer in the magnetic tunnel junction structure.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell change due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer (i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

FIG. 1 illustrates a magnetic tunnel junction ("MTJ") stack 100 for a conventional MRAM device. As shown, stack 100 includes one or more seed layers 110 provided at the bottom of stack 100 to initiate a desired crystalline growth in the above-deposited layers. Furthermore, MTJ 130 is deposited on top of SAF layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has a antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

Various mechanisms have been proposed to assist the free-layer magnetization switching in magnetic tunnel junction (MTJ) devices. One issue has been that to realize the orthogonal spin transfer effect for in-plane MTJ structures, large spin currents may be required for switching. The need for large switching currents may limit such device's commercial applicability. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

For perpendicular MTJ structures such as those shown in FIG. 1, the precession is not an issue. The orthogonal polarizer acts on the free layer magnetization at the initial state, but when the precession takes hold, the fixed orthogonal polarizer 150 helps only half the cycle of the free-layer magnetization rotation while it harms the other half of the cycle. This is demonstrated with reference to FIGS. 2-3. FIG. 2a-2b shows switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2a-2b show precession about the axis of the magnetization vector of free layer 136. During precession, magnetic vector 200 begins to rotate about its axis in a cone-like manner such that its magnetization vector 200' deflects from the perpendicular axis 202 of free layer 136. Whereas prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., switch), the rotation of vector 200' extends further from the center of free layer 136, as is seen in FIG. 2b.

In all prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2a as well as FIG. 3). Axis 202 is perpendicular to the plane of free layer 136. This damping 205 has value, defined by the damping constant, which maintains the magnetization direction of the free layer 136.

Passing a current through polarizer 150 produces a spin-polarized current, which creates a spin transfer torque 210 in the direction of the polarizer 150 on the magnetization vector 200. This spin transfer torque from the polarizer adds to the main spin transfer torque that causes free layer magnetization direction switching. In devices like those shown in FIG. 1, when the spin transfer torque 210 begins to help overcome the damping 205 inherent to the free layer 136, the magnetic direction 200' begins to precess about its axis, as shown in FIG. 2a. As seen in FIG. 3, spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e. it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates precession of a free layer 136 of an MTJ assisted by spin polarized current provided by polarizing magnetic layer 150. The spin polarized electrons from polarizer 150 provide torque 210 that helps overcome the damping 205 in the first half of the precession 215 because the torque 210 provided by the spin polarized current is opposite that of the inherent damping 205 of the free layer 136. This is shown on the right-hand side of the middle portion of FIG. 3. However, the spin polarized electrons from polarizer 150 actually harm the switching process during the second half of the precession 220. The reason for this is that the spin of the electrons in the spin polarized current only apply a torque 210 in the direction of their polarization. Thus, when the magnetic vector is in the half of the precession cycle 220 that is opposite the spin of the polarized electrons, the spin transfer torque 210 actually works with the inherent damping 205 of free layer 136 to make rotation more difficult. This is shown in the left-hand side of the middle portion of FIG. 3. Indeed, it is the magnetization vector of the reference layer 132 (not shown in FIG. 3) that overcomes the damping of free layer 136 as well as the spin transfer torque 210 during the half of a precession cycle where the spin of the electrons harms precession, and thus it is the reference layer 132 that allows for completion of precession.

Thus, in prior devices, because magnetization direction of polarizer 150 is fixed, once the precession holds, it has no positive effect on the switching mechanism for a full one-hundred eighty degree precession. This is because polarized electrons will help the spin transfer torque the most when all vectors are closely aligned.

Thus, there is a need for a spin torque transfer device that reduces the amount of current needed for switching while also switching at high speeds and requiring reduced chip area.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications.

In one embodiment, a magnetic device includes a synthetic antiferromagnetic structure in a first plane. The synthetic antiferromagnetic structure includes a magnetic reference layer having a magnetization vector that is perpendicular to the first plane and having a fixed magnetization direction. The device also includes a non-magnetic tunnel barrier layer in a second plane that is disposed over the magnetic reference layer. A free magnetic layer is in a third plane and is disposed over the non-magnetic tunnel barrier layer. The free magnetic layer has a magnetization vector that is perpendicular to the third plane and also has a magnetization direction that can precess from a first magnetization direction to a second magnetization direction. The magnetic reference layer, the non-magnetic tunnel barrier layer and the free magnetic layer form a magnetic tunnel junction. The device also includes a non-magnetic spacer in a fourth plane that is disposed over the free magnetic layer. The device includes a precessional spin current magnetic layer in a fifth plane that is physically separated from the free magnetic layer and coupled to the free magnetic layer by the non-magnetic spacer. The precessional spin current magnetic layer has a magnetization vector with a magnetization component in the fifth plane that can freely rotate in any magnetic direction. The device also includes a current source that directs electrical current through the precessional spin current magnetic layer, the non-magnetic spacer, the free magnetic layer, the non-magnetic tunnel barrier layer, and the magnetic reference layer. The electrons of the electrical current are aligned in the magnetic direction of the precessional spin current magnetic layer. The magnetization direction of the precessional spin current magnetic layer follows precession of the magnetization direction of the free magnetic layer, thereby causing spin transfer torque to assist switching of the magnetization vector of the free magnetic layer.

In another embodiment, the precessional spin current magnetic layer of the magnetic device has a circular shape.

In another embodiment, the magnetization direction of the magnetization vector of the precessional spin current magnetic layer is in the fifth plane.

In another embodiment, the magnetization direction of the precessional spin current magnetic layer has a magnetization component in the fifth plane which can freely rotate in the fifth plane.

In another embodiment, the precessional spin current magnetic layer comprises CoFeB.

In another embodiment, the precessional spin current magnetic layer is magnetically coupled to the free magnetic layer.

In another embodiment, the precessional spin current magnetic layer is electronically coupled to the free magnetic layer.

In another embodiment, precession of the precessional spin current magnetic layer is synchronized to precession of the free magnetic layer.

In another embodiment, the precessional spin current magnetic layer has a rotation frequency greater than zero.

In another embodiment, a magnetic device includes a precessional spin current magnetic layer in a first plane. The precessional spin current magnetic layer has a magnetization vector with a magnetization component in the first plane which can freely rotate in any magnetic direction. The device includes a non-magnetic spacer layer in a second plane and disposed over the precessional spin current magnetic layer. A free magnetic layer is in a third plane and disposed over the non-magnetic spacer layer. The free magnetic layer has a magnetization vector that is perpendicular to the third plane and also has a magnetization direction that can precess from a first magnetization direction to a second magnetization direction. The device has a non-magnetic tunnel barrier layer in a fourth plane and disposed over the free magnetic layer. A synthetic antiferromagnetic structure is in a fifth plane. The synthetic antiferromagnetic structure includes a magnetic reference layer having a magnetization vector that is perpendicular to the fifth plane. The magnetic reference layer has a fixed magnetization direction. The magnetic reference layer, the non-magnetic tunnel barrier and the free magnetic layer form a magnetic tunnel junction. The device has a current source that directs electrical current through the precessional spin current magnetic layer, the non-magnetic spacer, the free magnetic layer, the non-magnetic tunnel barrier, and the magnetic reference layer. Electrons of the electrical current are aligned in the magnetic direction of the precessional spin current magnetic layer. The magnetization direction of the precessional spin current magnetic layer follows precession of the magnetization direction of the free magnetic layer, thereby causing spin transfer torque to assist switching of the magnetization vector of the free magnetic layer.

In another embodiment, a magnetic device includes a magnetic tunnel junction in a first plane. The magnetic tunnel junction includes a free magnetic layer and a reference magnetic layer. The free magnetic layer and the reference magnetic layer are separated by a nonmagnetic tunneling barrier layer. The free magnetic layer has a magnetization vector that is perpendicular to the first plane, and can precess from a first magnetization direction to a second magnetization direction. The device also has a non-magnetic spacer in a second plane coupled to the free magnetic layer. A precessional spin current magnetic layer is in a third plane and is coupled through the non-magnetic spacer to the free magnetic layer. The precessional spin current magnetic layer is separated from the free magnetic layer by the non-magnetic spacer. The precessional spin current magnetic layer has a magnetization vector with a magnetization component in the third plane which can freely rotate in any magnetic direction. The magnetization direction of the precessional spin current magnetic layer follows precession of the magnetization direction of the free magnetic layer upon application of current to the device. This causes spin transfer torque to assist switching of the magnetization vector of the free magnetic layer.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

Figure 1:
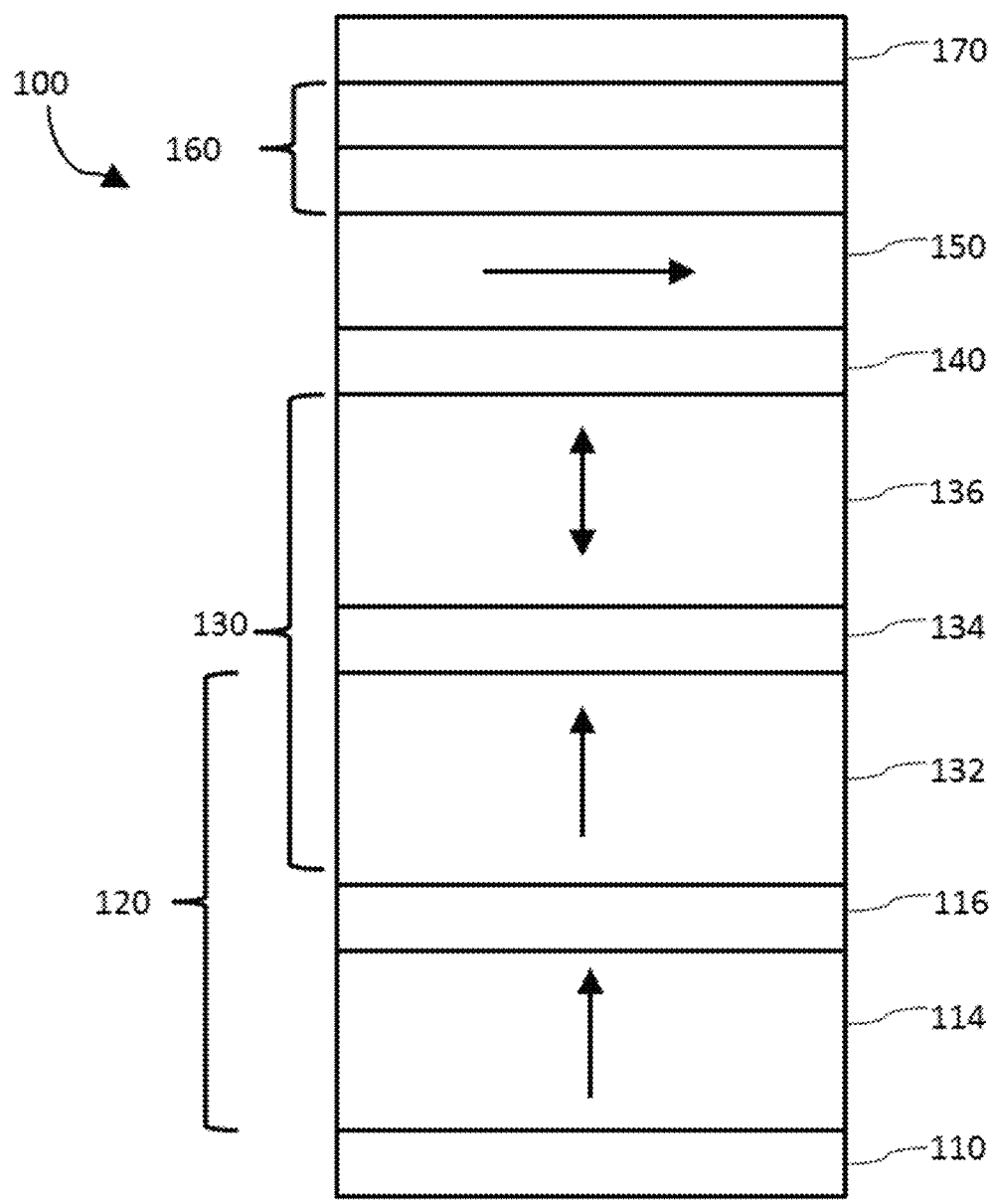
FIG. 1 illustrates a conventional MTJ stack for an MRAM device.
Figure 2A:
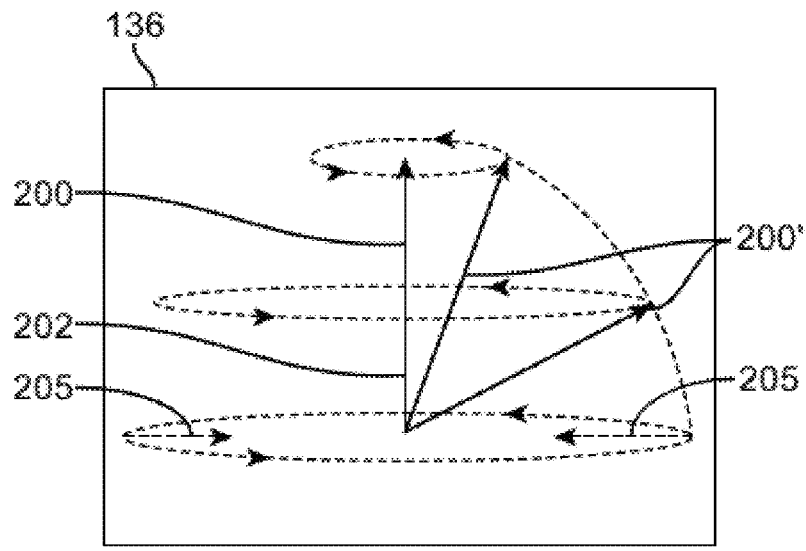
FIGS. 2A and 2B illustrate the precession of the free layer in an MTJ.
Figure 2B:
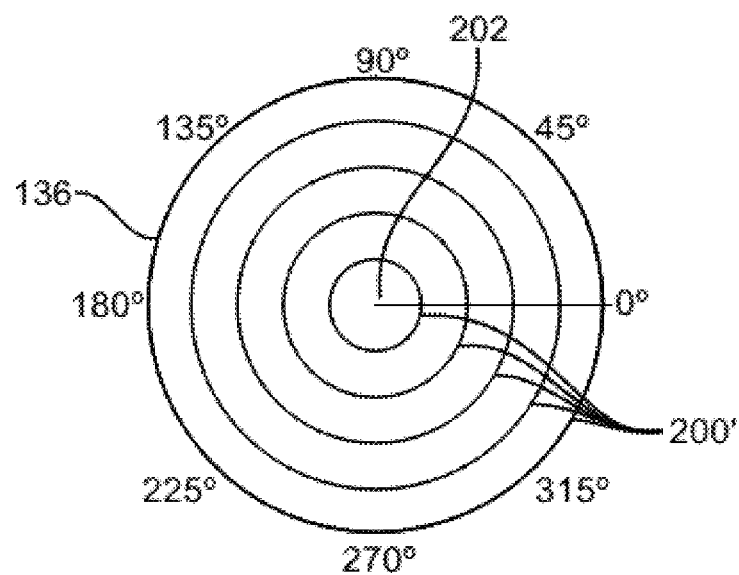

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a precessional spin current structure for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This present patent document discloses a MRAM device that does not use a polarization layer having a fixed magnetization direction, and is described with reference to FIGS. 3-7. Instead of a polarization layer having a fixed magnetization direction, the MRAM device described in this patent document utilizes a precessional spin current (PSC) magnetic layer 350 in conjunction with a perpendicular MTJ where the in-plane magnetization component direction of the PSC layer is free to rotate. In one embodiment, the PSC magnetic layer 350 will rotate with resonant behavior with the free-layer magnetization precessional dynamics. This will significantly improve the impact of the spin current in overcoming the inherent damping of the free layer 336 since the PSC layer will help the spin torque overcome this damping through the entire orbital motion of the precession cycle rather on only half of the precession. This precessional spin current effect throughout the entire one-hundred eighty degree rotation significantly enhances the free-layer magnetization switching.

Figure 4:
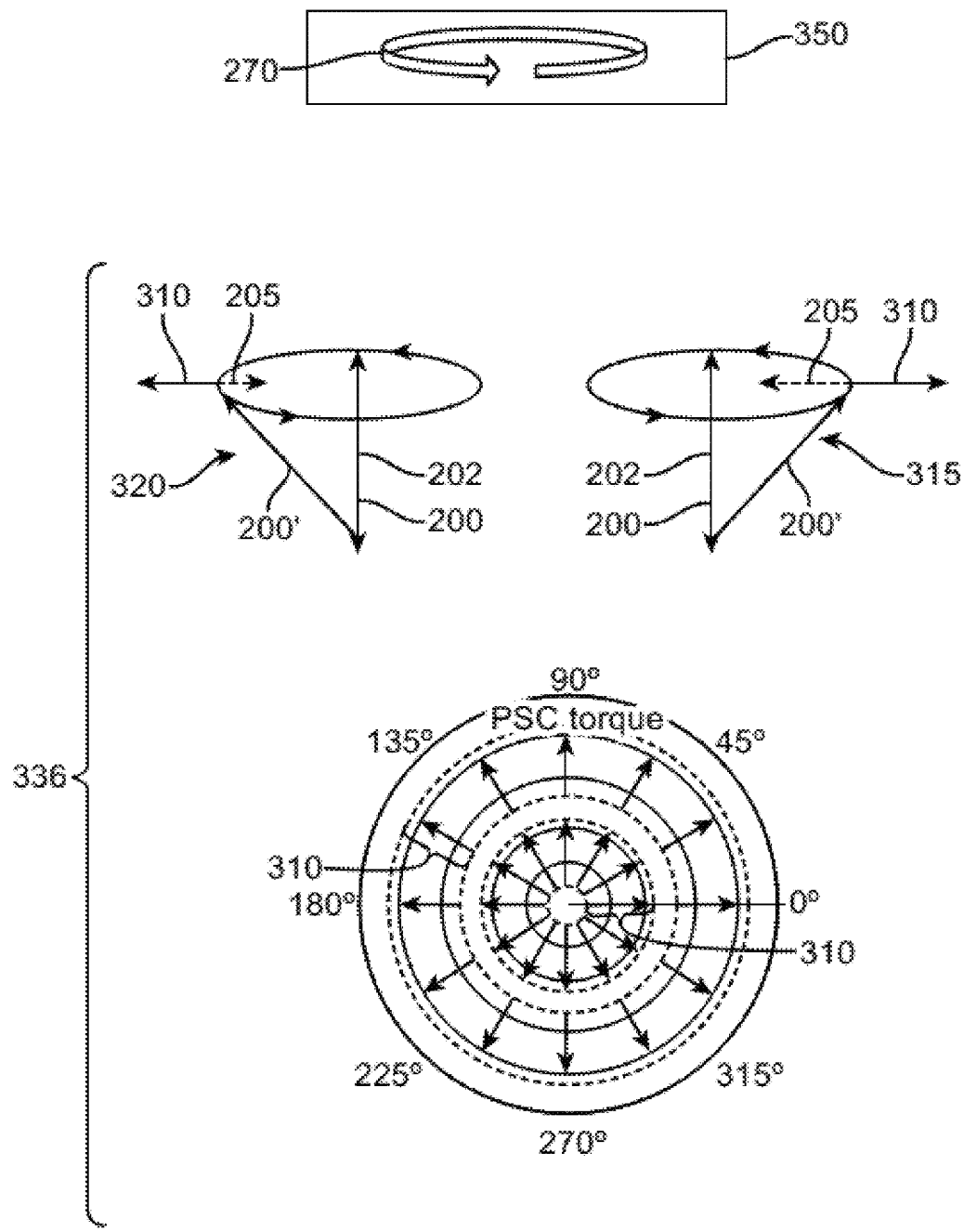
FIG. 4 illustrates the precession of the free layer in an MTJ used with a precessional spin current magnetic layer having a magnetization direction that rotates freely.

FIG. 4 shows the concept behind the MRAM device using a PSC magnetic layer 350 having magnetization vector 270 that rotates instead of a polarization layer 150 having a magnetic vector with a fixed magnetization direction. The free layer 336 in this embodiment is similar to the free layer 136 previously discussed, in that it has an inherent damping characteristic 205 that can be overcome with the assistance of spin transfer torque. However, the embodiment shown in FIG. 4 replaces polarizing layer 150 with PSC magnetic layer 350. As seen in the bottom portion of FIG. 4, the direction of the spin transfer torque 310 created by spin current passing through free layer 336 changes with the rotation of PSC magnetic layer 350. As seen in the middle of FIG. 4, spin transfer torque 310 causes the magnetization direction 200' of the free layer 336 to precess in a cone-like manner around an axis 202 perpendicular to the plane of the layers. FIG. 4, shows a progression of rotation of the magnetic direction 200' about axis 202. As discussed, when a spin polarized current traverses the device, the magnetization of the free layer 336 precesses in a continuous manner (i.e. it turns on itself in a continuous manner as shown in FIG. 4) with maintained oscillations until the magnetic direction of free layer 336 is opposite the magnetic direction prior to the spin torque causing precession, i.e., the magnetic direction of free layer 136 switches by 180 degrees. The precessional spin current layer 350 and the free-layer 336 are magnetically and/or electronically coupled such that the magnetization direction of the magnetization vector 270 of the PSC magnetic layer 350 follows the precessional rotation of the magnetic vector of the free layer 336. This can be seen in FIG. 4.

As seen in on the right-hand side of FIG. 4, the spin polarized electrons provide torque 310 helps to overcome the damping 205 in the first half of the precession 215 because the torque 310 provided by the spin polarized current is opposite that of the inherent damping 205 of the free layer 336. As discussed, the magnetization direction of magnetization vector 270 of PSC magnetic layer 350 rotates. Thus, the polarization of electrons of the spin current created by PSC magnetic layer 350 changes as well. This means that the direction of torque 310 exerted on magnetic vector of free layer 336 changes well, which is seen on the bottom of FIG. 4. Thus, unlike prior devices having a fixed polarization magnetic layer 150, the spin of the electrons in the spin polarized current applies a torque 310 in both halves of the precession cycle, including the half of the precession cycle 220 where devices with fixed polarization magnetic layers 150 actually harmed precession. This is seen in the left-hand side of FIG. 4. As is seen, the torque 310 continues to help overcome the inherent damping 205 of free layer 136 throughout the entire precession cycle.

In an embodiment, the precessional vector 270 of the PSC magnetic layer 350 follows the precessional rotation of the magnetic vector of the free layer 336 by being in alignment therewith. In other embodiments, precessional vector 270 of the PSC magnetic layer 350 follows the precessional rotation of the magnetic vector of the free layer 336 by trailing the free layer's magnetic vector, as will be discussed below. The magnetization direction of the free layer is switched by the spin torque 310 from the reference layer 132 where the direction of the current defines the final state.

Figure 5:
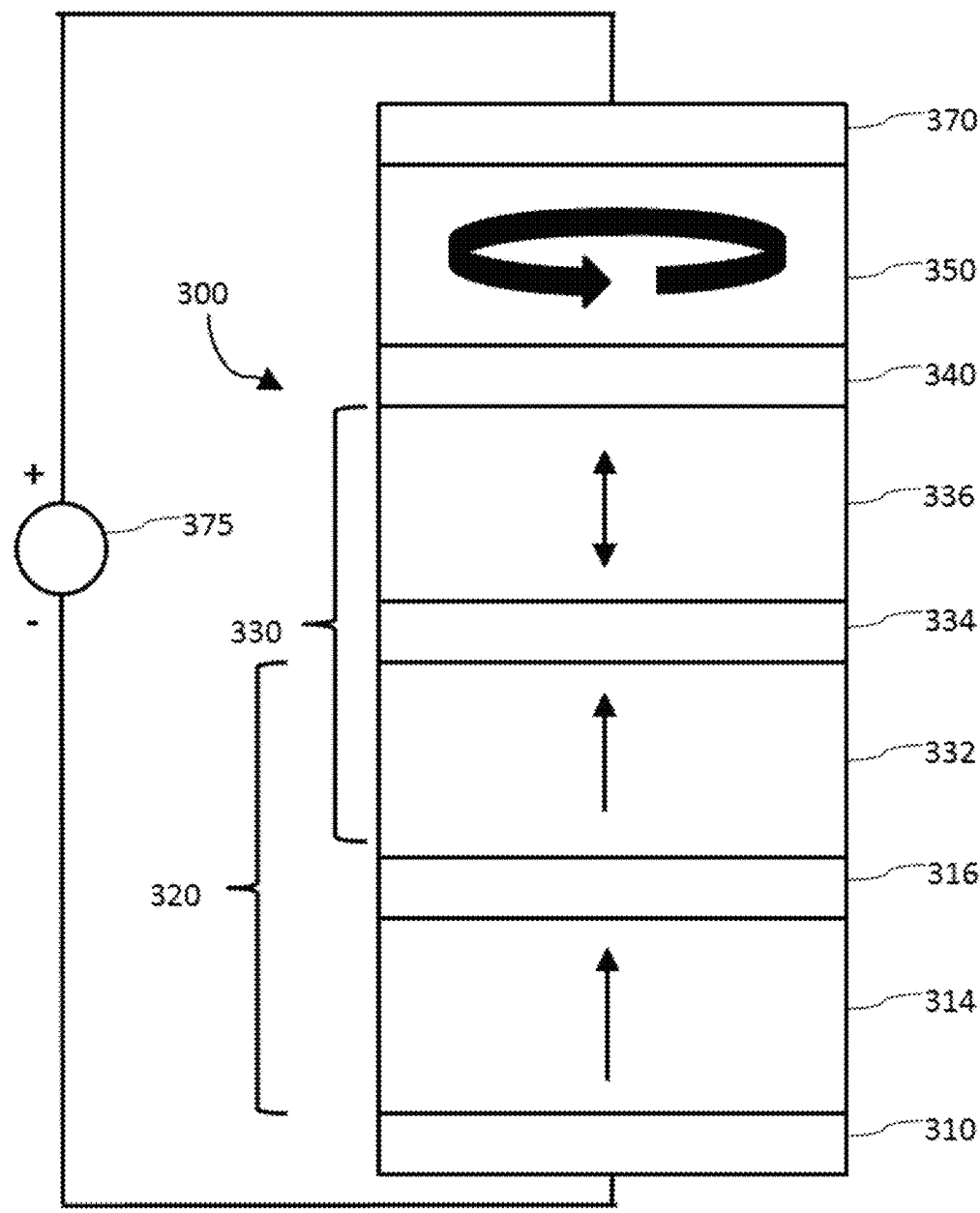
FIG. 5 illustrates an MTJ stack for an MRAM device having a precessional spin current magnetic layer.

A memory cell with a precessional spin current MTJ structure 300 is shown in FIG. 5. MTJ structure 300 includes one or more seed layers 310 provided at the bottom of stack 300 to initiate a desired crystalline growth in the above-deposited layers. Synthetic antiferromagnetic (SAF) layer 320 is disposed over seed layer 310. SAF layer 320 is comprised of a first SAF layer 332, anti-ferromagnetic coupling layer 316 and second SAF layer 314. Second SAF layer 314 is deposited over seed layer 310, while anti-ferromagnetic coupling layer 316 is placed over second SAF layer 314. MTJ 330 is deposited over anti-ferromagnetic coupling layer 316. MTJ 330 includes first SAF layer 332, which acts as the reference layer of the MTJ, and is also part of SAF layer 320. A tunneling barrier layer (i.e., the insulator) 334 is over first SAF layer 332 while the free layer 336 is disposed over tunneling barrier layer 334. As shown in FIG. 5, the magnetization vector of first SAF layer 332 has a magnetization direction that is preferably perpendicular to its plane, although variations of a several degrees are within the scope of what is considered perpendicular. As also seen in FIG. 5, free layer 336 also has a magnetization vector that is preferably perpendicular to its plane, but its direction can vary by 180 degrees. A nonmagnetic spacer 340 is disposed over of MTJ 330. PSC magnetic layer 350 is disposed over nonmagnetic spacer 340. In one embodiment, PSC magnetic layer 350 has a magnetization vector having a magnetic direction parallel to its plane, and is perpendicular to the magnetic vector of the reference layer 132 and free layer 136. One or more capping layers 370 can be provided on top of PSC layer 150 to protect the layers below on MTJ stack 100.

Nonmagnetic spacer 340 has a number of properties. For example, nonmagnetic spacer 340 physically separates the free layer 336 and the PSC layer 350. Nonmagnetic spacer 340 promotes strong magnetic and/or electronic coupling such that the magnetic direction of the PSC magnetic layer 350 follows the precession cycle of the free layer 336. In other words, nonmagnetic spacer 340 couples the magnetic direction of the PSC magnetic layer 350 to the magnetic direction of the free layer 336. Nonmagnetic spacer 340 transmits spin current efficiently from the PSC magnetic layer 350 into the free layer 336 because it preferably has a long spin diffusion length. Nonmagnetic spacer 340 also promotes good microstructure and high tunneling magnetoresistance (TMR) and helps keep the damping constant of the free layer 336 low.

Figure 6:
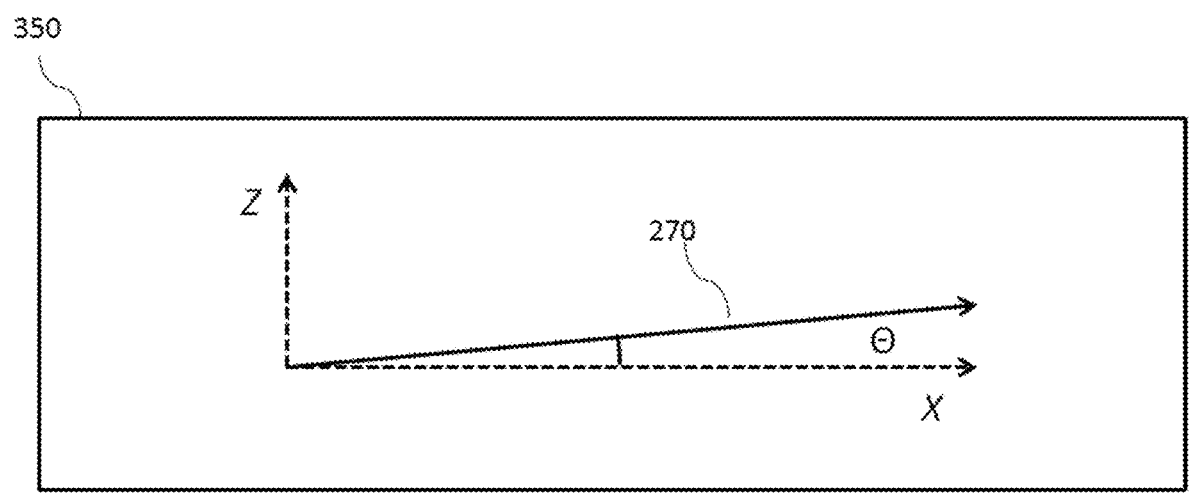
FIG. 6 illustrates the magnetic direction of the precessional spin current magnetic layer of an embodiment.

PSC magnetic layer 350 has at least the following properties. First, in one embodiment, the magnetization direction of PSC magnetic layer 350 is in the plane of the layer but is perpendicular to magnetization direction of free layer 336. In other embodiments such as shown in FIG. 6, the magnetization direction of PSC magnetic layer 350 can have a horizontal component X and perpendicular component Z such that the angle Ĩ between the plane of free layer 336 and the magnetic direction 270 of PSC magnetic layer 350 can be anywhere between 0 and less than 90 degrees.

PSC magnetic layer 350 preferably has very low coercivity and is therefore manufactured with a very soft magnetic material, e.g., less than fifty (50) Oersteds. PSC magnetic layer 350 should have a strong magnetic coupling to free layer 336 so that its magnetization direction follows magnetic direction of free layer 336 as it precesses about its axis. In one embodiment, PSC magnetic layer 350 is free to rotate near the same frequency as the precessional motion of the free layer 336. By having nearly the same frequency of the magnetization rotations (PSC magnetic layer 350 magnetization direction and free layer 336 magnetization precession), the free layer switching time is significantly reduced and also tightens the thermal distribution of switching times. In an embodiment, PSC magnetic layer 350 has a rotation frequency greater than zero. Likewise, in an embodiment, PSC magnetic layer 350 has a circular (or near circular) shape so that its magnetization direction has no shape induced anisotropy in the x-y plane (i.e., in the plane of the magnetic film).

Seed layer 310 in the MTJ structure shown in FIG. 5 preferably comprises Ta, TaN, Cr, Cu, CuN, Ni, Fe or alloys thereof. Second SAF layer 314 preferably comprises either a Co/Ni or Co/Pt multilayer structure. First SAF layer 332 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 316 is preferably made from Ru having thickness in the range of three to ten Angstroms. Tunneling barrier layer 334 is preferably made of an insulating material such as MgO, with a thickness of approximately ten Angstroms. Free layer 336 is preferably made with CoFeB deposited on top of tunneling barrier layer 334. Free layer 336 can also have layers of Fe, Co, Ni or alloys thereof. Spacer layer 340 over MTJ 330 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer.

PSC magnetic layer 350 is preferably made from CoFeB. It can also be made with Co, Fe, Ni magnetic layers or can be made out of their alloys. The magnetic alloys can also have boron, tantalum, copper or other materials. Finally capping layer 370 can be any material that provides good interface to PSC layer such as Ta, TaN, Ru, MgO, Cu, etc.

The manner in which a bit is written using the precessional spin current MTJ structure 300 will now be described. In particular, an electrical current is supplied, for example, by a current source 375, which passes electrical current through the precessional spin current magnetic layer 350, the non-magnetic spacer 340, the free magnetic layer 336, the non-magnetic tunneling barrier layer 334, and the reference layer 332. The electrons of the electrical current passing through the precessional spin current magnetic layer 350 become spin polarized in the magnetic direction thereof, thus creating a spin polarized current that passes through non-magnetic spacer layer 340, free magnetic layer 336, tunneling barrier layer 334, and reference magnetic layer 332. The spin polarized current exerts a spin transfer torque on free magnetic layer 336, which helps overcome the inherent damping of the magnetic material making up the free layer 336. This causes the free magnetic layer 336 to precess about its axis, which is shown in FIG. 4.

Once the magnetic direction of the free magnetic layer 336 begins to precess, the magnetic direction of the PSC magnetic layer 350 begins to rotate, as is also seen in FIG. 4. This rotation is caused by the magnetic and/or electronic coupling between the free magnetic layer 336 and the PSC magnetic layer 350 through the non-magnetic spacer 340. The rotation of the magnetic direction of the PSC magnetic layer 350 causes the spin polarization of the electrons of the electrical current to change in a manner corresponding to the magnetic direction of the PSC magnetic layer 350. Because the spin of the electrons of the spin polarized current corresponds to the magnetic direction of PSC magnetic layer 350, and the magnetic direction of PSC magnetic layer 350 follows the precession of free magnetic layer 336, the spin of the electrons applies spin transfer torque to the free layer 336 in a direction that varies through an entire switching cycle. Thus, devices using PSC magnetic layer 350 can provide spin transfer torque 205 for an entire switching cycle.

In particular, the structure described herein utilizing PSC magnetic layer 350 and spacer layer 340 creates precessional magnetization that provides spin current to the free layer 336 of an MTJ throughout the whole precession cycle and therefore significantly enhance the free layer switching process, which will result in faster write times.

Figure 7A:
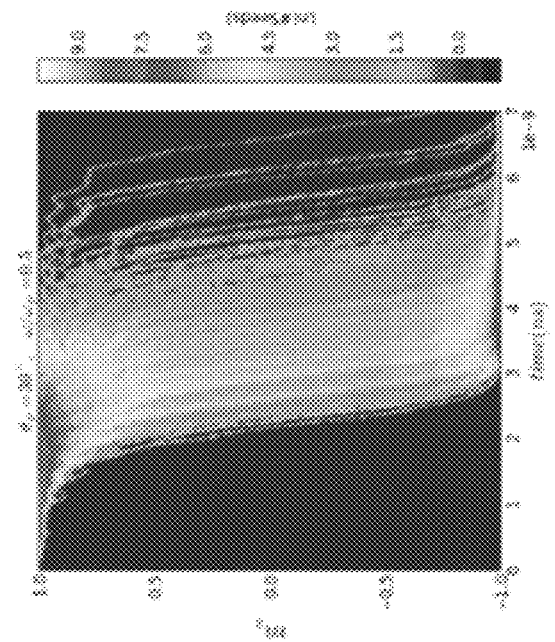
FIGS. 7A-7E are graphs of simulations illustrating the improvement in performance of MTJ devices having precessional spin current magnetic layer.
Figure 7B:
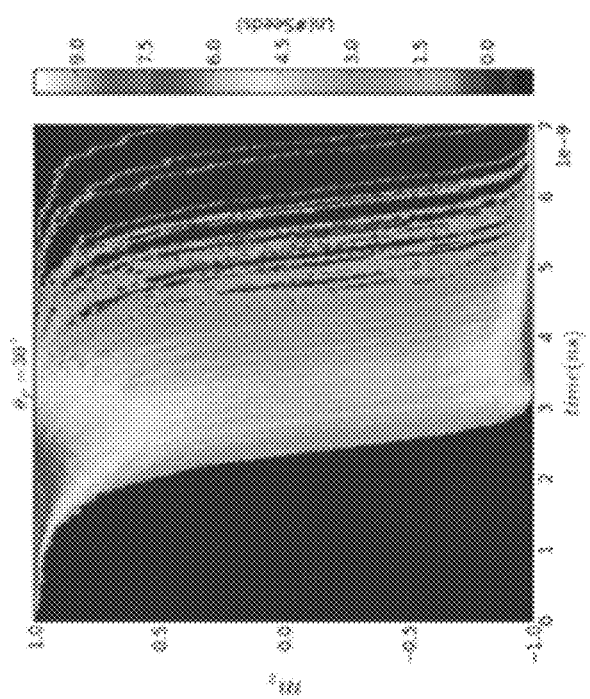
Figure 7C:
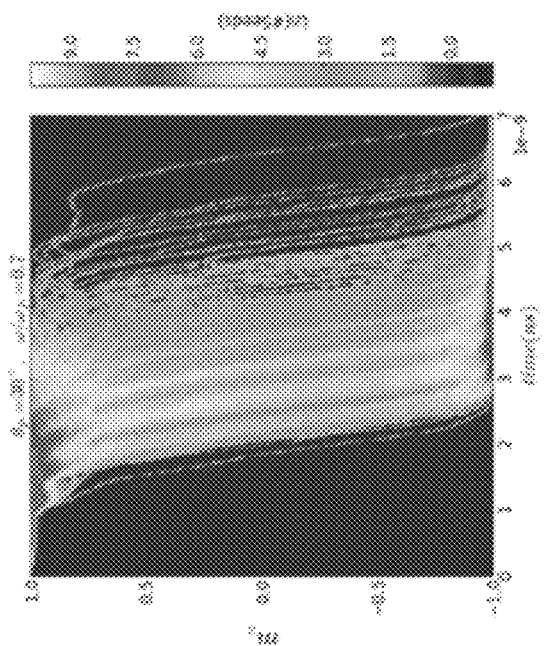
Figure 7E:
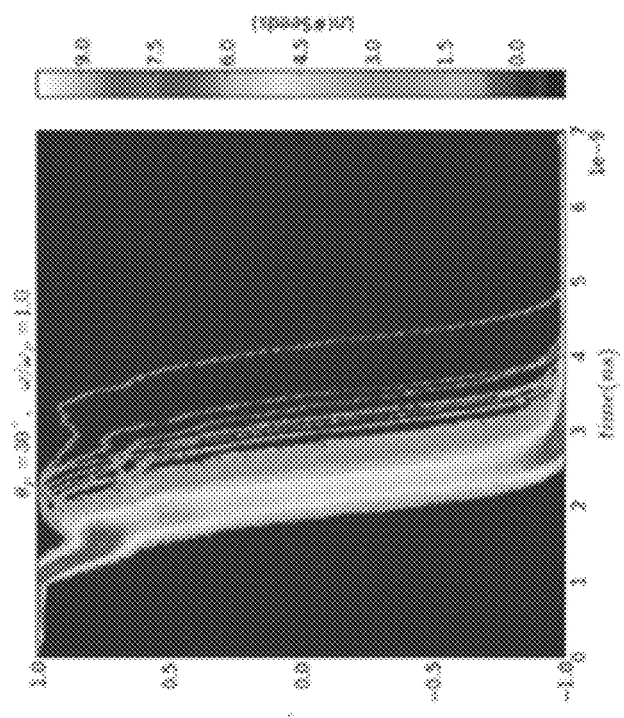

The results of simulating a device having the structure described herein are seen in FIGS. 7a-7e. In FIGS. 7a-7e, the Y axis is the magnetization in the Z axis of a device 300 from −1.0 to +1.0. The X axis shows the amount of time it takes with switch the magnetization direction of free layer 336 180 degrees. In the simulations, the precession frequency of the magnetization direction of the PSC magnetic layer 350 is designated as (w) while the precessional frequency of free layer 336 is designated as (wp). The results are shown for w/wp ratios of 0 (FIG. 7a), 0.5 (FIG. 7b), 0.7 (FIG. 7c), 0.9 (FIG. 7d), and 1.0 (FIG. 7e). In all cases the tilt angle is 30 degrees, which indicates the efficiency of the spin current effect.

Figure 3:
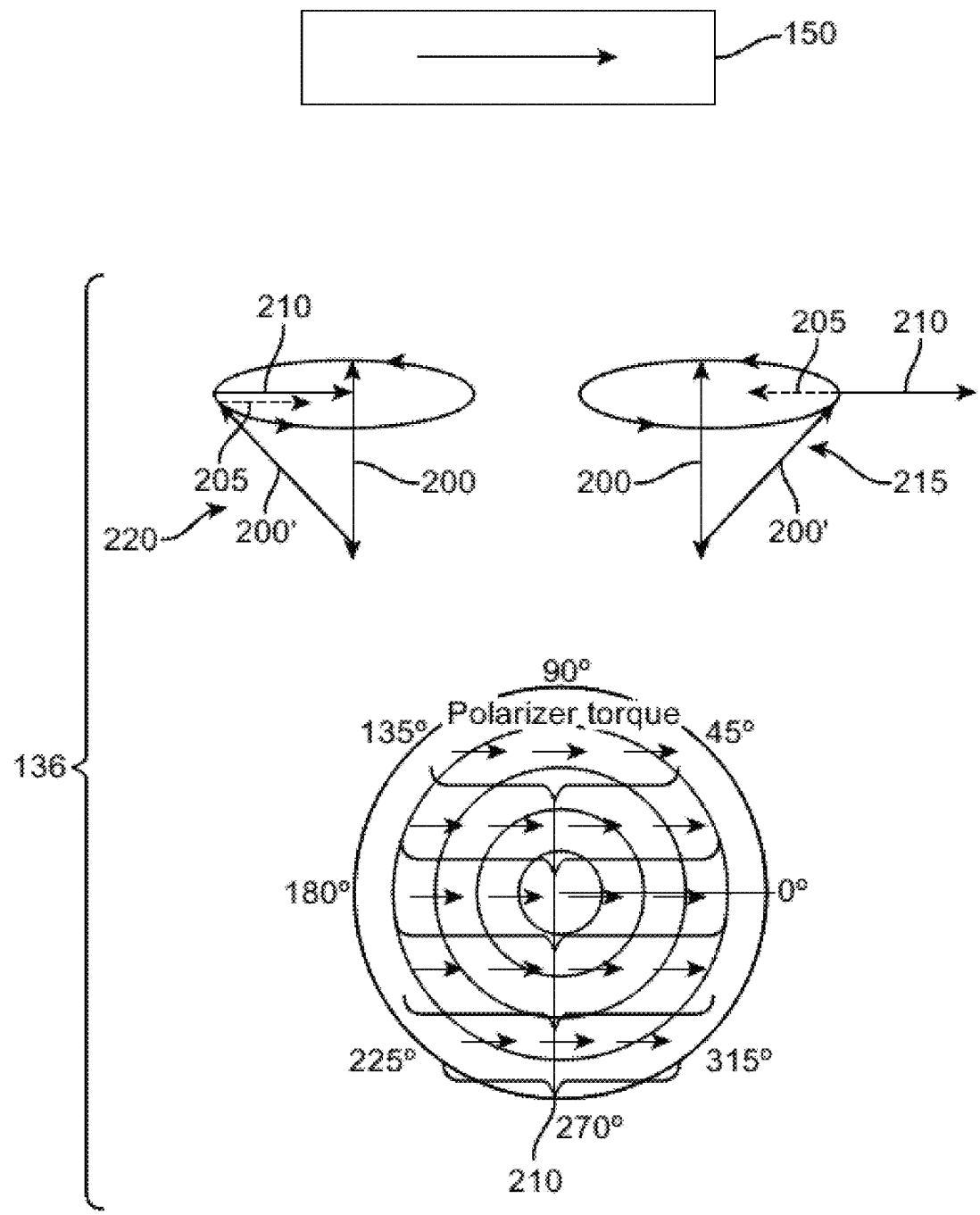
FIG. 3 illustrates the precession of the free layer in an MTJ used with a polarizing magnetic layer having a fixed magnetization direction.
Figure 7D:
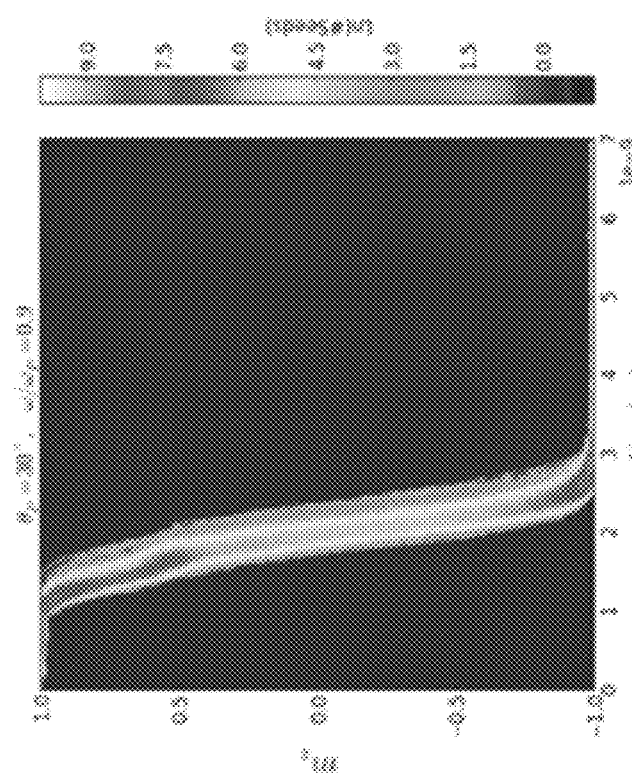

Because the $w/w_p$ ratio for the device shown in FIG. 8a is 0, the PSC magnetic layer 350 is not rotating. Thus, the results shown in FIG. 7a actually show the switching time for a device as in FIGS. 1 and 3, i.e., a device with a polarizing layer 150 in which the magnetization direction does not rotate. In contrast, FIGS. 7b-7e show the switching times for w/wp ratios for a device as in FIGS. 4-6, i.e., a device with a PSC magnetic layer 350 in which the magnetization direction rotates and thus follows the precession of free layer 336. In these embodiments, PSC magnetic layer 350 has a rotation frequency greater than zero. Note that the $w/w_p$ ratio indicates how closely the precessional vector 270 of the PSC magnetic layer 350 follows precession of the free layer 336. In other words, as the $w/w_p$ ratio approaches unity, the more closely aligned are the precessional vector 270' of the precessing PSC magnetic layer 350 and the magnetic direction of precessing free layer 336. As is seen in the simulations shown in FIGS. 7a-7e, the more the precessional vector 270 of the precessing PSC magnetic layer 350 and the magnetic direction of precessing free layer 336 are aligned, the shorter the switching times of the magnetization direction of layer 336. Thus, in an embodiment, the frequency of rotation of the precessional vector 270 of the precessing PSC magnetic layer 350 is synchronized to be close to the frequency of rotation of free layer 336. FIG. 7a shows the switching time for a device such as shown in FIGS. 1 and 3, in which the magnetization direction of polarizer 150 is fixed and thus has a frequency of rotation of zero. This embodiment has the longest switching time. As the ratio of the precession frequency w of PSC magnetic layer 350 to the precession frequency of free layer 336 $w_p$ increases to 0.5, the switching speed has increases. As is seen in FIGS. 7c-7e, as the ratio of the precession frequency w of PSC magnetic layer 350 to the precession frequency of free layer 336 $w_p$ increases to 0.7, 0.9 and then to 1.0, the switching speed has increased significantly, thus demonstrating the significant improvement provided by the various embodiments described herein.

Figure 8:
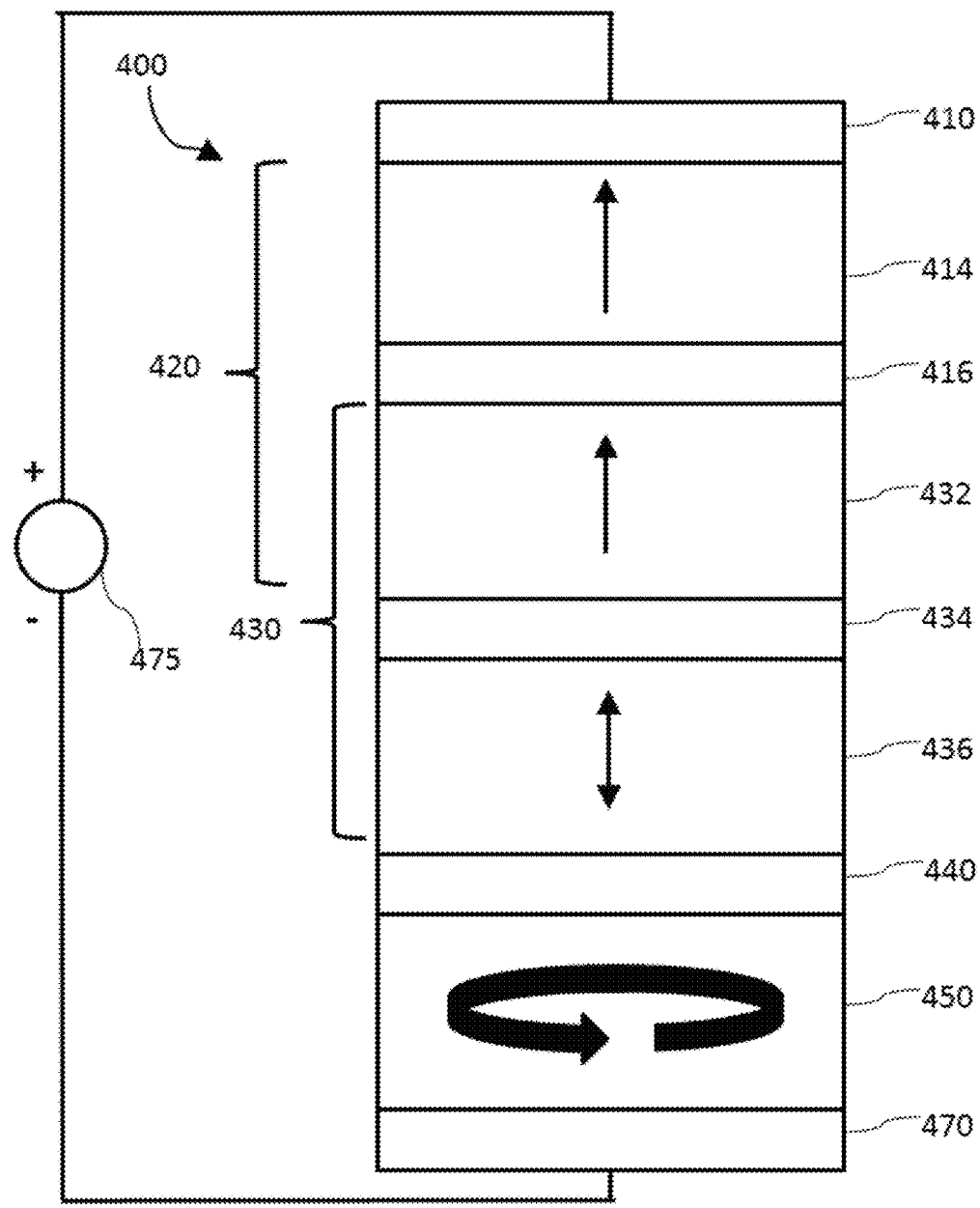
FIG. 8 illustrates an alternative embodiment of an MTJ stack for an MRAM device having a precessional spin current magnetic layer.

An alternative embodiment is shown in FIG. 8. In this embodiment, magnetic device 400 has had its MTJ stack inverted with respect to the embodiment shown in FIG. 5. In particular, magnetic device 400 includes a seed layer 470. PSC magnetic layer 450 is placed over seed layer 450. Nonmagnetic spacer 440 is placed over PSC layer 450. Nonmagnetic spacer 440 has the same properties, construction and characteristics as nonmagnetic spacer 340, discussed above. PSC magnetic layer 450 has the same properties, construction and characteristics as PSC magnetic layer 350, discussed above. MTJ 430 is placed over nonmagnetic spacer 440. MTJ 430 is generally constructed of free layer 436 (which is placed over nonmagnetic spacer 450) and reference layer 432. Free layer 436 and reference layer 432 are spatially separated from each other by tunneling barrier layer 434, which is made of an insulating material. Tunneling barrier layer 434 also forms part of synthetic antiferromagnetic (SAF) layer 420. SAF layer 420 is comprised of a first SAF layer 432, which is also the reference layer of device 400, anti-ferromagnetic coupling layer 416 and second SAF layer 414. Anti-ferromagnetic coupling layer 416 is placed over first SAF layer 432. Finally, capping layer 410 is placed over SAF layer 420. Current can be provided by a current source 474. Other than the ordering of the layers, magnetic device operates in the same manner as described with respect to the embodiment shown in FIG. 5. Thus, just as shown in FIG. 4, PSC magnetic layer 450 rotates in such a way that spin transfer torque 310 is applied in a beneficial manner throughout the entire precession cycle of free layer 436.

All of the layers of devices 300 and 400 illustrated in FIGS. 5 and 8 can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stack 300 are well-known to those skilled in the art and will not be described in detail herein so as not to unnecessarily obscure aspects of the disclosure herein.

It should be appreciated to one skilled in the art that a plurality of MTJ structures 300 can be manufactured and provided as respective bit cells of an STT-MRAM device. In other words, each MTJ stack 300 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising
a synthetic antiferromagnetic structure in a first plane, the synthetic antiferromagnetic structure including a magnetic reference layer, the magnetic reference layer having a magnetization vector that is perpendicular to the first plane and having a fixed magnetization direction;
a non-magnetic tunnel barrier layer in a second plane and disposed over the magnetic reference layer;
a free magnetic layer in a third plane and disposed over the non-magnetic tunnel barrier layer, the free magnetic layer having a magnetization vector that is perpendicular to the third plane and having a magnetization direction that precesses from a first magnetization direction to a second magnetization direction when a spin-polarized current passes there through, the magnetic reference layer, the non-magnetic tunnel barrier layer and the free magnetic layer forming a magnetic tunnel junction;
a non-magnetic spacer in a fourth plane and disposed over the free magnetic layer;
precessional spin current means in a fifth plane for causing a magnetization vector with a magnetization component in the fifth plane of the precessional spin current means to follow precession of the magnetization direction of the free magnetic layer, the precessional spin current means being physically separated from the free magnetic layer and electronically coupled to the free magnetic layer by the non-magnetic spacer, wherein rotation of the magnetization component in the fifth plane of the precessional spin current means causes spin polarization of electrons of electrical current passing there through to change in a manner corresponding to the magnetic vector in the fifth plane of the precessional spin current means, thereby creating the spin-polarized current, the spin-polarized current causing spin transfer torque to assist switching of the magnetization vector of the free magnetic layer, the free magnetic layer storing a memory value.

2. The magnetic device of claim 1 wherein the precessional spin current means has a circular shape.

3. The magnetic device of claim 1 wherein a magnetization direction of the magnetization vector of the precessional spin current means is in the fifth plane of the precessional spin current means.

4. The magnetic device of claim 1 wherein a magnetization direction of the precessional spin current means has the magnetization component in the fifth plane of the precessional spin current means that freely rotates in the fifth plane.

5. The magnetic device of claim 1 wherein the precessional spin current means comprises CoFeB.

6. The magnetic device of claim 1 wherein the precessional spin current means is magnetically coupled to the free magnetic layer.

7. The magnetic device of claim 1 wherein precession of the magnetization vector with the magnetization component in the fifth plane of the precessional spin current means is synchronized to precession of the free magnetic layer.

8. The magnetic device of claim 1 wherein the magnetization vector with the magnetization component in the fifth plane of the precessional spin current means has a rotation frequency greater than zero.

9. The magnetic device of claim 1, further comprising a current source that directs the electrical current through the precessional spin current means, the non-magnetic spacer, the free magnetic layer, the non-magnetic tunnel barrier layer, and the magnetic reference layer, wherein the electrons of the electrical current are aligned in a magnetic direction of the precessional spin current means.

10. A magnetic device, comprising:
a magnetic tunnel junction in a first plane comprising a free magnetic layer and a reference magnetic layer, the free magnetic layer and the reference magnetic layer separated by a non-magnetic tunneling barrier layer, the free magnetic layer having a magnetization vector that is perpendicular to the first plane and having a magnetization direction that precesses when a spin-polarized current passes there through from a first magnetization direction to a second magnetization direction;
a non-magnetic spacer in a second plane disposed over the free magnetic layer;
a precessional spin current means in a third plane for causing a magnetization vector with a magnetization component in the third plane of the precessional spin current means to follow precession of the magnetization direction of the free magnetic layer upon application of a current to the magnetic device, wherein the magnetization component in the third plane of the precessional spin current means freely rotates in any magnetic direction in the third plane, the precessional spin current means being electronically coupled through the non-magnetic spacer to the free magnetic layer, the precessional spin current means separated from the free magnetic layer by the non-magnetic spacer, wherein rotation of the magnetization component in the third plane of the precessional spin current means causes spin polarization of electrons of the current passing there through via the magnetic device to change in a manner corresponding to the magnetization vector of the precessional spin current means, thereby creating the spin-polarized current, the spin-polarized current thereby causing spin transfer torque to assist switching of the magnetization vector of the free magnetic layer, the free magnetic layer storing a memory value.

11. The magnetic device of claim 10 wherein the precessional spin current means has a circular shape.

12. The magnetic device, of claim 10 wherein a magnetization direction of the magnetization vector of the precessional spin current means is in the third plane of the precessional spin current means.

13. The magnetic device of claim 10 wherein a magnetization direction of the magnetization vector of the precessional spin current means has the magnetization component in the third plane which freely rotates in the third plane of the precessional spin current means.

14. The magnetic device of claim 10 wherein the precessional spin current means comprises CoFeB.

15. The magnetic device of claim 10 wherein the precessional spin current means is magnetically coupled to the free magnetic layer.

16. The magnetic device of claim 10 wherein precession of the magnetization vector with the magnetization component in the third plane of the precessional spin current means is synchronized to precession of the free magnetic layer.

17. The magnetic device of claim 10 wherein the magnetization vector with the magnetization component in the third plane of the precessional spin current means has a rotation frequency greater than zero.

* * * * *